US009291335B2

(12) United States Patent
Kataoka

(10) Patent No.: US 9,291,335 B2

(45) Date of Patent: Mar. 22, 2016

(54) LIGHT-EMITTING DEVICE WITH ELECTRICALLY INSULATED LED MODULE

(75) Inventor: Takaaki Kataoka, Hirakata (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 810 days.

(21) Appl. No.: 13/164,011

(22) Filed: Jun. 20, 2011

(65) Prior Publication Data

US 2012/0020086 A1 Jan. 26, 2012

(30) Foreign Application Priority Data

Jun. 18, 2010 (JP) ................................ 2010-138972

(51) Int. Cl.

*F21V 21/00* (2006.01)
*H01L 33/58* (2010.01)
*F21V 19/00* (2006.01)
*F21V 5/04* (2006.01)
*H01R 4/48* (2006.01)

(52) U.S. Cl.

CPC ............... *F21V 19/0055* (2013.01); *F21V 5/04* (2013.01); *H01R 4/4818* (2013.01)

(58) Field of Classification Search

CPC ............ F21V 19/0055; F21V 19/0004; H01R 4/4818

See application file for complete search history.

(56) References Cited

U.S. PATENT DOCUMENTS

2006/0141851 A1* 6/2006 Matsui et al. ................. 439/490
2007/0127227 A1* 6/2007 Osawa ............................ 362/29
2010/0006871 A1* 1/2010 Imai et al. ....................... 257/89

FOREIGN PATENT DOCUMENTS

JP 2009176733 8/2009

* cited by examiner

*Primary Examiner* — Nimeshkumar Patel
*Assistant Examiner* — Jacob R Stern
(74) *Attorney, Agent, or Firm* — Patterson Intellectual Property Law, P.C.; Mark J. Patterson; Gary L. Montle

(57) ABSTRACT

A lighting fixture includes an outer surface with pairs of fastening holes to receive LED lighting devices. The devices include an insulating base substrate, an LED module engaging the base substrate and including positive and negative power supply input terminals, and an insulating device housing shaped to cover the base substrate and the LED module when engaged therewith. A plurality of terminal board modules are integral to the device housing and effective to electrically couple respective external power supply conductors to the power supply input terminals of the LED module. The base substrate and the device housing further include a pair of through holes corresponding to an associated pair of holes on the fixture surface. When a fastener couples the base substrate and the device housing to the fixture, the LED module is insulated with respect to the fastening device and outer surface.

14 Claims, 6 Drawing Sheets

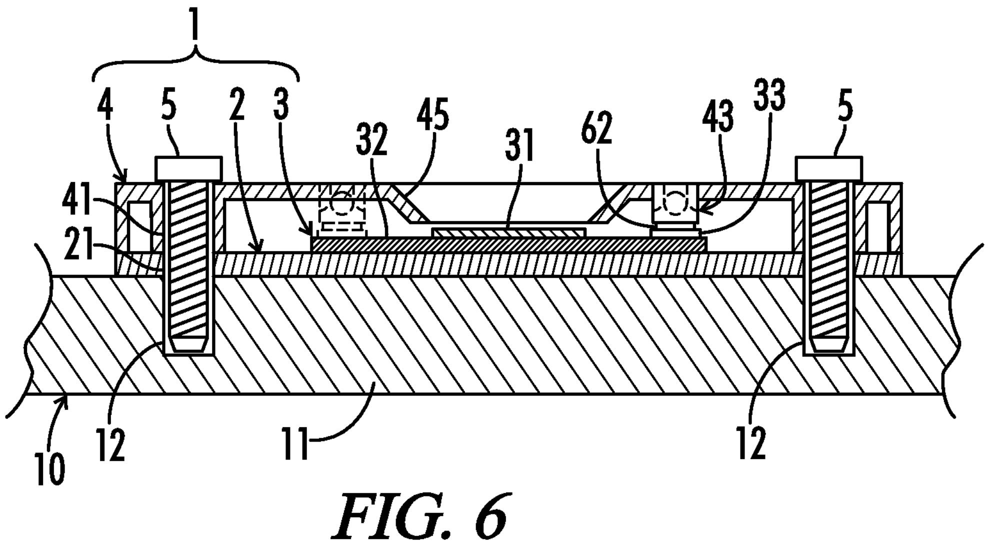
FIG. 6
FIG. 7
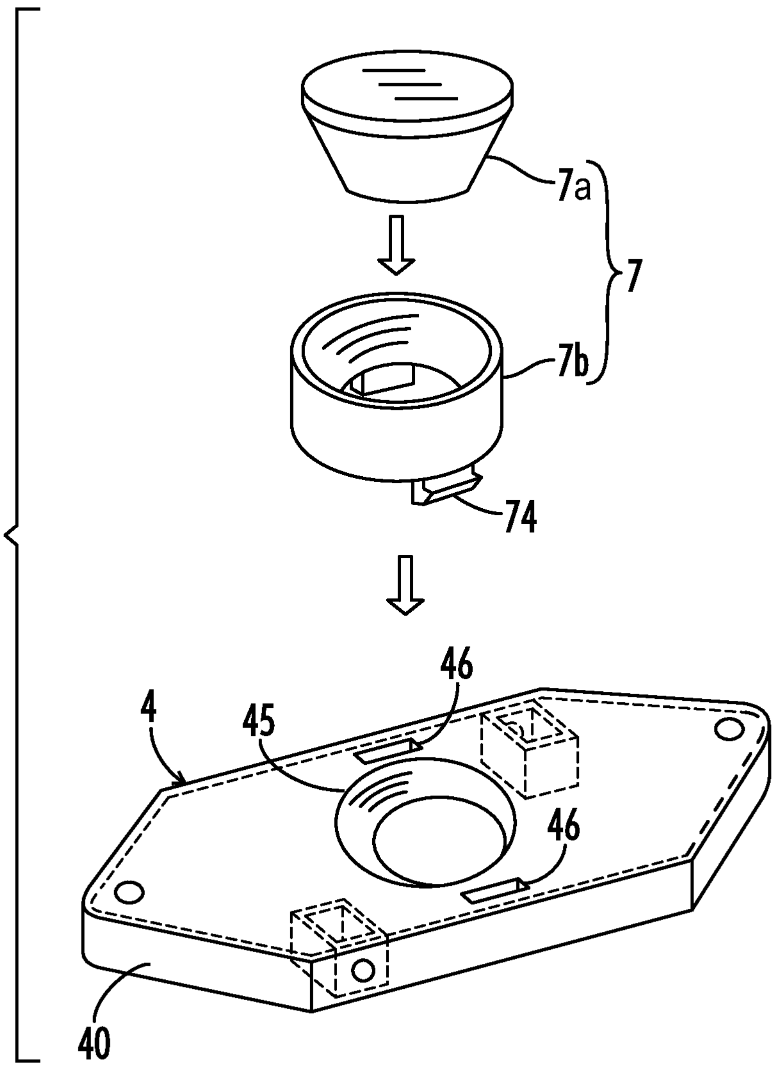

FIG. 8
FIG. 8(a)
FIG. 8(b)
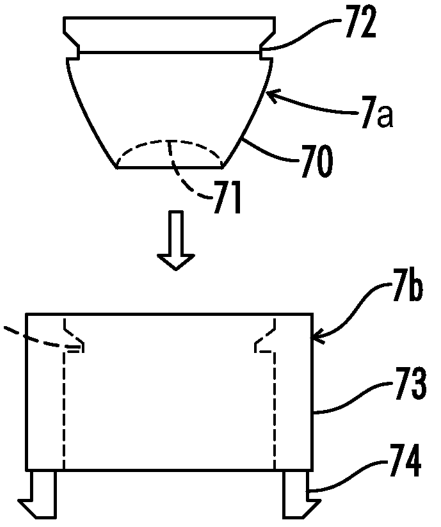
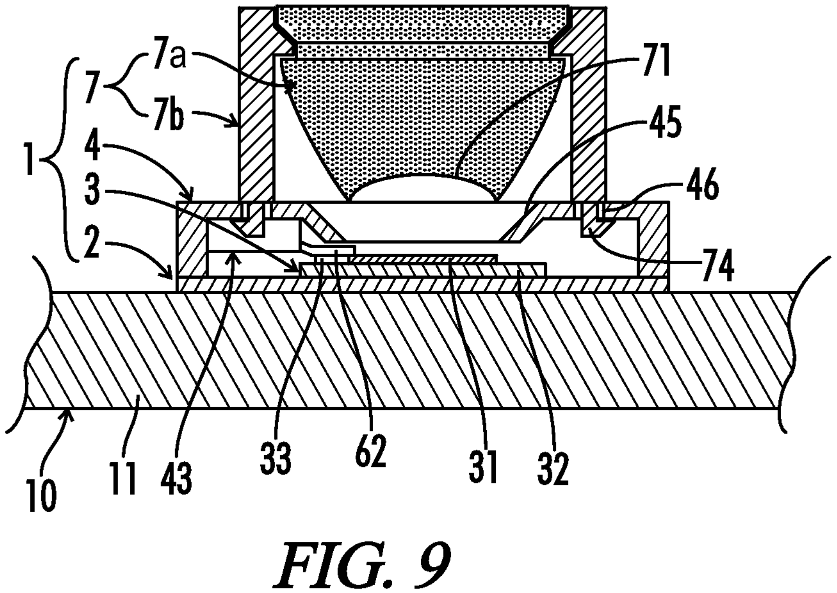
FIG. 9

LIGHT-EMITTING DEVICE WITH ELECTRICALLY INSULATED LED MODULE

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application which is hereby incorporated by reference: Japan Patent Application No. 2010-138972, filed Jun. 18, 2010.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to lighting fixtures having one or more light-emitting devices, and more particularly to light-emitting devices having electrically insulated LED modules with respect to the main body of the lighting fixture and respective fasteners.

Light-emitting devices are known in the art in which an LED module including one or more LED chips is mounted on a substrate, the substrate being covered by a cover having a terminal board, and with power supplied from the terminal board to the LED module via the substrate. Such a conventional light-emitting device has a contact pattern arranged to allow electrical connection between the substrate and the terminal board. The contact pattern and the LED module are connected to each other by a wiring pattern or equivalent coupling. The substrate and the cover are fastened with screws to a metallic main body so as to allow contact and connection between the terminal board and the substrate, thereby improving ease of assembly.

However, soldering is generally applied in such devices to allow electrical connection between the LED module and the substrate. A solder crack may frequently occur in the substrate and/or the LED module caused by thermal shock. The substrate may be provided with a conductor foil spread close to an end surface of a screw hole when a conductive pattern is formed. If a metal screw is used, the electrical insulation properties between the substrate and the main body are easily deteriorated, including a dielectric breakdown under application of high voltage. If a screw is alternatively made of resin, the screw itself may deteriorate due to secular changes and stresses caused by thermal deformation, further resulting in low reliability in terms of strength.

BRIEF SUMMARY OF THE INVENTION

An exemplary light-emitting device within the scope of the present invention may be fixed with screws to a main body of a lighting fixture, and includes an LED module mounted on an insulating substrate further by the use of an insulating cover, whereby solder cracks resulting from thermal shock are substantially prevented by eliminating the need for soldering between the LED module and the substrate. Also, electrical isolation between the LED module and the main body can be sufficiently secured.

A lighting fixture in accordance with an embodiment of the present invention includes an outer surface with pairs of fastening holes to receive LED lighting devices. The devices include an insulating base substrate, an LED module engaging the base substrate and including positive and negative power supply input terminals, and an insulating device housing shaped to cover the base substrate and the LED module when engaged therewith. A plurality of terminal board modules are integral to the device housing and are effective to electrically couple respective external power supply conductors to the power supply input terminals of the LED module. Both of the base substrate and the device housing further include a pair of through-holes corresponding to an associated pair of holes on the fixture surface. When a fastener couples the base substrate and the device housing to the fixture, the LED module is insulated with respect to the fastening device and outer surface.

In an aspect of another exemplary embodiment, each of the terminal board modules for an associated device housing define an interior portion and an exterior portion, and further include a flexible contact portion extending from the interior portion to engage a respective power supply input terminal when the device housing is positioned with respect to the base substrate. A terminal board entry portion is shaped to receive an external power supply conductor wherein the conductor engages the flexible contact portion.

In another aspect, the exterior portions of the respective terminal board modules further define a surface shaped to engage a corresponding surface of the associated LED module when the device housing is coupled to the base substrate via the fastening device, wherein the LED module is pressure fitted to the base substrate.

In another aspect, the respective base substrates include a recess shaped to receive an associated LED module.

In another aspect, the respective LED modules each include one or more LED chips coupled to an LED substrate, with the LED chips electrically coupled to the power supply input terminals via printed leads upon or within the LED substrate.

In another aspect, the respective LED modules each include a single LED chip, and the device housing further includes a recessed portion having an outer aperture of a first diameter and an inner aperture of a second aperture smaller than the first aperture and larger than a diameter of the LED chip. The recessed portion extends from an outer surface of the device housing to envelop the LED chip.

BRIEF DESCRIPTION OF THE SEVERAL VIEWS OF THE DRAWINGS

FIG. 2(*b*) is a side surface view of the base substrate shown in FIG. 2(*a*).

FIG. 2(*c*) is an undersurface view of the base substrate shown in FIGS. 2(*a*) and 2(*b*).

FIG. 3(*b*) is a side surface view of the cover shown in FIG. 3(*a*).

FIG. 3(*c*) is an undersurface view of the cover shown in FIGS. 3(*a*) and 3(*b*).

FIG. 5(*b*) is a plan view illustrating the spring member of FIG. 5(*a*) attached to the terminal board of the cover.

FIG. 6 is a cross sectional view of the light-emitting device of FIG. 1.

FIG. 7 is an exploded perspective view of a cover according to another exemplary embodiment of the present invention.

FIG. 8(*a*) is a side surface view of a lens in an optical member of the cover of FIG. 7.

FIG. 8(*b*) is a side surface view of a lens housing used with the optical member of FIG. 8(*a*).

FIG. 9 is a cross sectional view of an embodiment of the light-emitting device in accordance with FIG. 7.

DETAILED DESCRIPTION OF THE INVENTION

Figure 1:
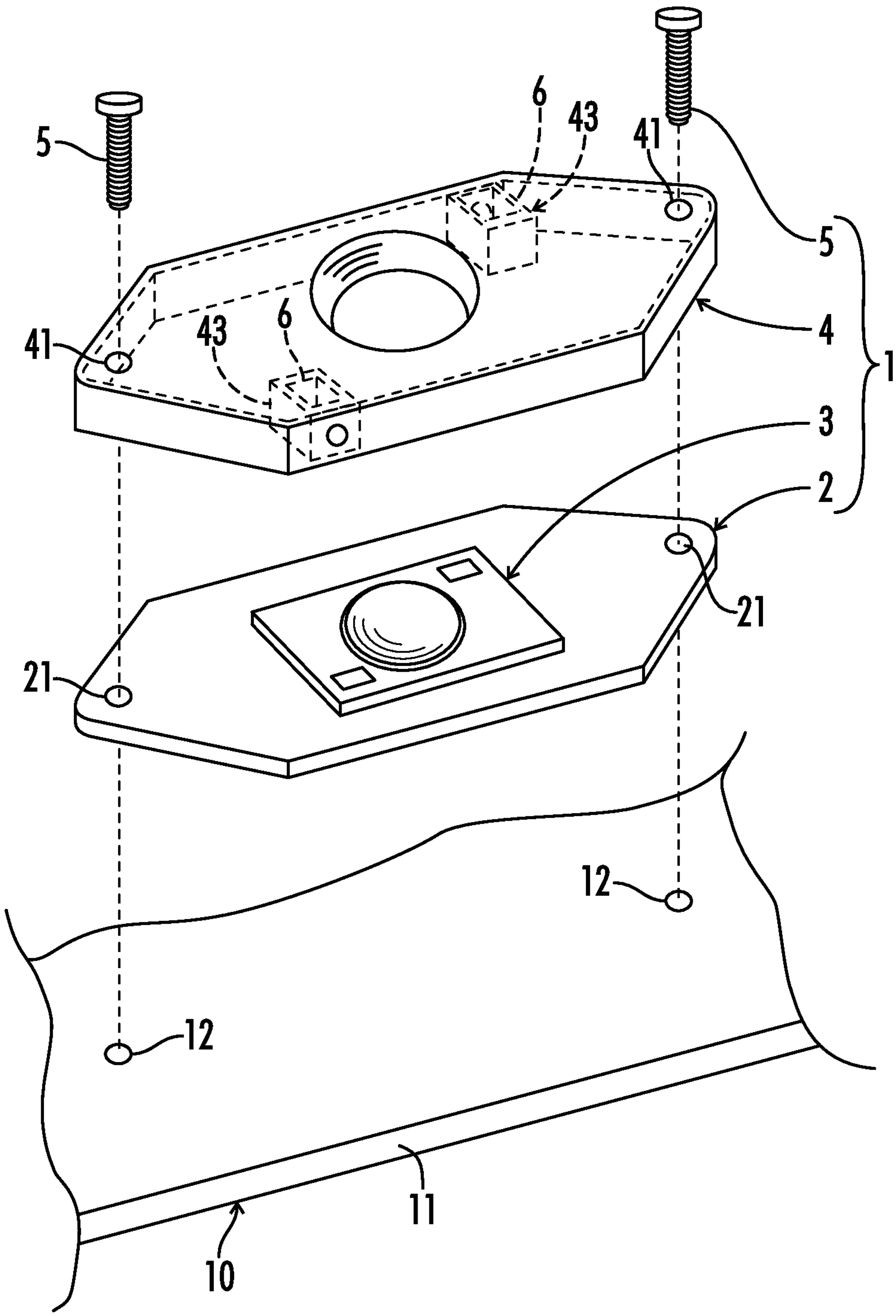
FIG. 1 is an exploded perspective view of an embodiment of a light-emitting device according to the present invention.
Figure 2A:
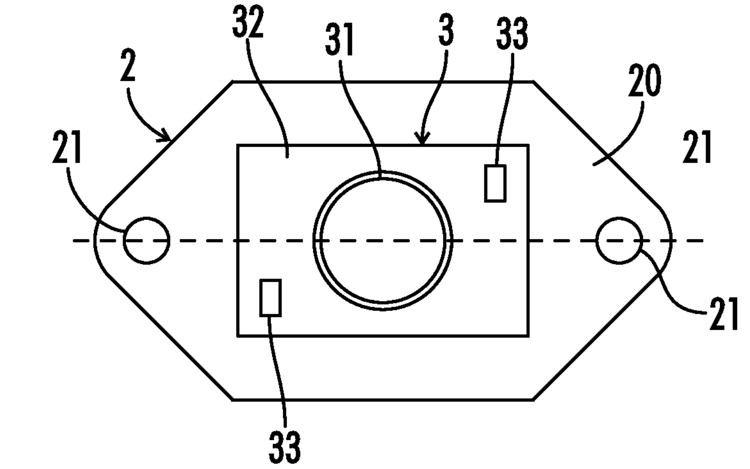
FIG. 2(*a*) is a plan view of a base substrate used in the light-emitting device of FIG. 1.
Figure 2B:
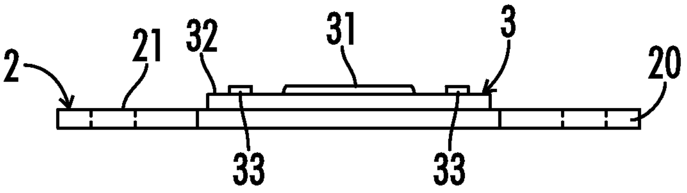
Figure 2C:
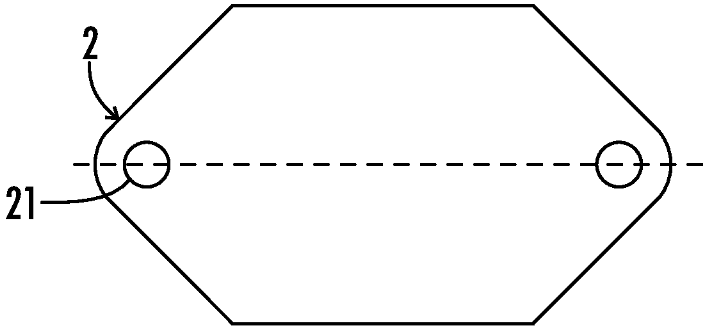
Figure 3A:
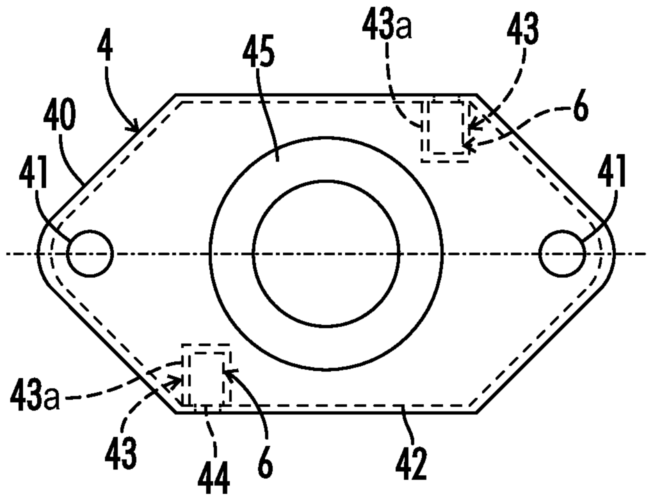
FIG. 3(*a*) is a plan view of a cover used in the light-emitting device shown in FIG. 1.
Figure 3B:
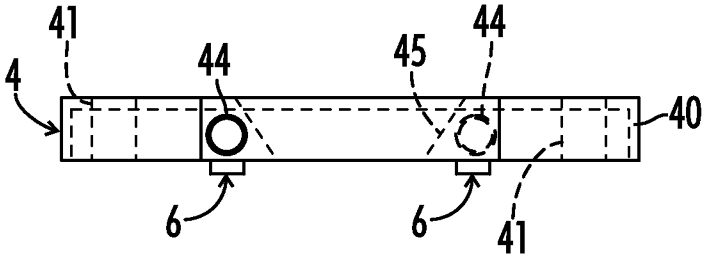
Figure 3C:
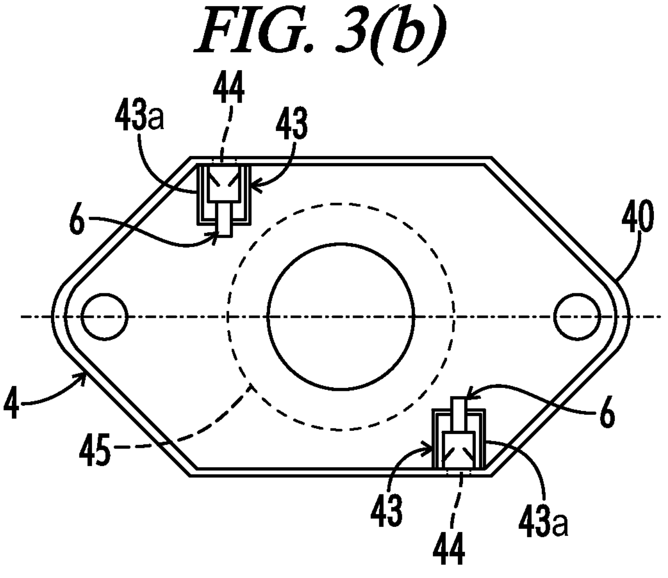
Figure 4:
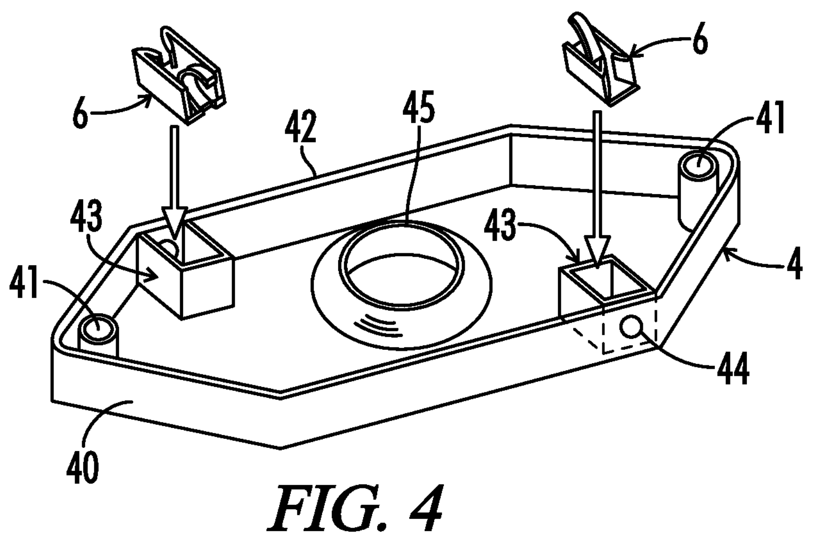
FIG. 4 is an exploded perspective view of the cover used in the light-emitting device of FIG. 1, as seen from the undersurface of the cover.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct connection between recited items or an indirect connection through one or more passive or active intermediary devices. "Coupled" may further unless otherwise stated herein mean either of a temporary connection such as may be obtained for example through the use of a general adhesive, a semi-permanent connection such as may be provided for example through the use of a mechanical fastener, or a permanent connection such as may be obtained for example by welding or soldering of the recited items together.

A light-emitting device according to various embodiments of the present invention may now be explained with reference generally to FIGS. 1 to 6. Where the various figures may describe embodiments sharing various common elements and features with other embodiments, similar elements and features are given the same reference numerals and redundant description thereof may be omitted below.

As represented in FIGS. 1-4, an embodiment of a light-emitting device 1 in accordance with the present invention includes a base substrate 2, an LED module 3, a cover 4, and a fastening device (such as a screw or equivalent structure) 5. The light emitting device 1 may be fixed to a main body 11 of a lighting fixture 10. The LED module 3 is mounted on the base substrate 2.

The cover 4 may also have a terminal board function provided by a terminal board module 43, including a flexible contact portion 6 which contacts LED module 3 so as to supply power. While referred to generally herein as a "flexible" contact portion, the contact portion 6 may in various embodiments be formed of any electrically conductive member effective to extend from a location within the terminal board to a location wherein the LED module 3 may engage the respective contact portion 6 and receive power. Also, the screw 5 is engaged with the cover 4 and the base substrate 2, without physically engaging or otherwise being electrically coupled to the LED module 3 itself, and is affixed to screw hole 12 of the main body 11 by passing through each of through-holes 41 and 21 in cover 4 and the base substrate 2.

The base substrate 2 in various embodiments has a heat conducting frame 20 of a planar hexagonal shape. Two of the through-holes 21 are formed in the heat conducting frame 20 on a central line running in parallel with opposing longitudinal sides thereof in a symmetrical state relative to the center of the base substrate 2, and a given distance away from LED module 3. Any of various insulating members and metal members as known in the art can be used for the base substrate 2, but in a particular embodiment an insulator with rigidity and high heat conductivity such as ceramics is used. If the rear surface of an LED module mounted on a metallic base substrate or the like is insulated by an insulation sheet or the like, it would be generally accompanied by poor workability and thermal conductivity. Alternatively, the base substrate 2 may be made of an insulator with high heat conductivity that exhibits excellent heat dissipation even if the LED module 3 is directly mounted thereon, such that various of the aforementioned problems are substantially avoided.

The LED module 3 in an embodiment has an LED chip 31 serving as a light emitting source, a rectangular mounting substrate 32 serving as a housing for the LED chip 31, and power supply input terminals 33 having a rectangular conductor pattern which are formed in two places on the mounting substrate 32. The LED chip 31, for example a blue LED or equivalent light-emitting source, is mounted on the mounting substrate 32 and sealed by a phosphor or equivalent sealant as is known in the art. For the mounting substrate 32, materials such as resin, ceramics, and aluminum can be used and, in various embodiments, an insulating member with excellent heat conductivity to be selected from resins and ceramics is used.

The power supply input terminals 33 respectively serve as positive and negative connection terminals to supply power to the LED chip 31, and may for example be formed by printing or the like in the vicinity of two obliquely opposing corners on the mounting substrate 32. The power supply input terminals 33 are electrically connected to positive and negative electrode terminals of the LED chip 31 respectively by wirings (not shown) which are formed on the surface and/or within the inside of the mounting substrate 32. The power supply input terminals 33 also are supplied power by being in contact with the flexible contact member 6 of the cover 4 (with reference to FIG. 3). Note that the mounting substrate 32 may be circular or polygonal and is not necessarily limited to the rectangular form represented.

The cover 4 has a frame 40 having a bottom surface side used to cover the LED module 3. The external shape thereof as seen from an upper surface side thereof is substantially the same as an external shape of the base substrate 2. An insulating member such as resin and ceramics may be used for the cover 4. The cover 4 has a through hole—41 of, for example, a cylindrical shape protruding downward from the upper surface of the frame 40, two terminal boards 43 each of which is integrally formed on a side wall 42 of the frame 40, an entry portion (insertion hole) 44 to allow insertion of an external power supply conductor to the terminal board 43, an aperture 45 for irradiating light, and the flexible contact member 6 attached to the terminal board 43. Note that in certain embodiments a metal member may be used for the cover 4.

The terminal boards 43 are provided with two rectangular exterior portions 43*a* defining terminal board housings, each of which is integrally formed with the side wall 42. The top surface in the frame 40 and has an opened bottom surface. Each of the exterior portions 43*a* is formed into a size which is large enough to allow the flexible contact member 6 to be inserted from the opened bottom surface into an interior portion and attached thereto. Two of the exterior portions 43*a* are made to be proximal to respective ends of two parallel longitudinal sides out of six sides of the side walls 42, and arranged to obliquely face each other. Each of the exterior portions 43*a* is also formed so that the flexible contact portion 6 inside the terminal board 43 contacts the power supply input terminals 33 of the LED module 3 when the base substrate 2 is covered by the cover 4.

An aperture 45 is formed into a hollow inverse circular truncated cone shape on the upper surface of the frame 40, having an inclined surface with a diameter being made smaller from the top surface to the bottom surface side of the frame 40 (i.e., the outer diameter is greater than the inner diameter). The aperture 45 has an aperture diameter on the bottom surface side (the inner diameter) that is larger than a diameter of the LED chip 31, and is arranged so as to surround the LED chip 31. The inclined surface is used to externally reflect light from the LED chip 31. The inclined surface may be formed of, for example, white resin or aluminum deposition for better reflectance efficiency. Note that the cover 4 has a thickness of, for example, about 5 mm and can in various embodiments be formed integrally by resin molding or other methods.

Figure 5A:
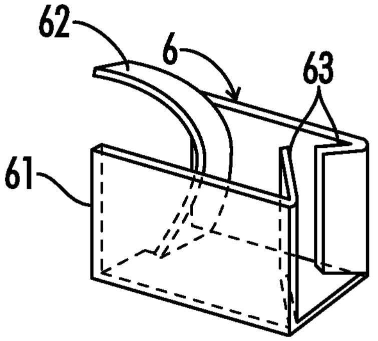
FIG. 5(*a*) is a perspective view of a spring member which is inserted into a terminal board in the cover of the light-emitting device of FIG. 1.
Figure 5B:
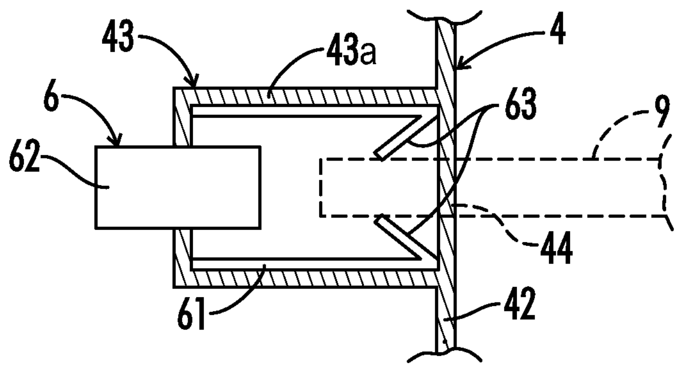

In an embodiment as represented in FIGS. 5A and 5B, the flexible contact portion 6 has a U-shaped frame 61 made of a metal material, a flexible (e.g., elastic) contact member 62 formed on an open side in one end of the longitudinal direction in the frame 61, and a flexible (e.g., elastic) housing 63 formed on the opening side in the other end. The contact portion 6 may be formed by, for example, sheet metal processing and metal welding.

The contact member 62 is formed in such a way that a part of the bottom surface of the frame 61 is extended and bent upward from the bottom surface side. A tip end of the curved plane projects upward from the inside of the frame 61. The tip end serves as a contact terminal which contacts a corresponding positive or negative power supply input terminal 33 of the LED module 3. The housing 63 is formed such that two opposing side surfaces of the frame 61 are extended by a predetermined length in a direction opposite to the contact member 62 and bent to the inside of the frame 61 in an opened gate state, while maintaining a right angle relative to the bottom surface of the frame 61 by using an end portion of the side surface of the frame 61 as an axis, so that each of the side surfaces serves as a contact piece. The interval or gap between tip end portions of these contact pieces is narrower than the diameter of the external power supply line 6 extended to the terminal board 43.

The frame 61 is fitted into the case 43*a* of the terminal board 43 and therefore the contact portion 6 is fixed. When an external power supply line (conductor) 9 is inserted into the terminal board 43 from the insertion hole 44 of the side wall 42 of the cover 4, the housings 63 of the contact portion 6 are brought into contact with the external power supply line 9 by holding it between the contact pieces thereof, whereby the contact portion 6 and the external power supply line 9 are electrically connected to each other.

As shown in FIG. 6, the cover 4 and the base substrate 2 are, at such time that the LED module 3 and the base substrate 2 are covered by the cover 4, both proximately engaged together and further affixed to the main body 11 by screws 5. The contact member 62 of the contact portion 6 in the terminal board 43 is pressed and fitted to the power supply input terminal 33 of the LED module 3, whereby the LED module 3 and the contact portion 6 contact each other and therefore electrically coupled, allowing power supply to the LED chip 31 from the external power supply line.

The LED module 3 is in various embodiments thereby mounted on the base substrate 2 without direct affixation. The base substrate 2 and the cover 4 are affixed by screws 5, such that the LED module 3 is held by the contact portion 6 of the cover 4 and the base substrate 2, and affixed to base substrate 2 by pressure bonding. The contact portion 6 exhibits not only an electrically coupling effect for supplying power to the LED module 3 but also a pressure bonding effect for pressing the LED module 3 to the base substrate 2. The positioning of the LED module 3 on the base substrate 2 may be determined by arranging, on the base substrate 2, a recess having a shape which is substantially the same as an external shape of the LED module 3 and a size which is slightly larger than that of the LED module 3, or arranging engagement portions which are correspondingly engaged between the cover 4 and the LED module 3. The LED module 3 externally irradiates light emitted from the LED chip 31 through the aperture 45 of the cover 4, in response to power supplied from the terminal board 43, when sealed by the cover 4.

In the light-emitting device 1 configured as stated above, the external power supply line 9 is coupled to the contact portion 6 of the terminal board 43. The contact portion 6 is coupled to the power supply input terminals 33 of the LED module 3, whereby power is supplied to the LED module 3. Therefore, the LED module 3 is, by being simply in contact with the contact portion 6 of the cover 4, and without intervention of the base substrate 2, allowed to have power directly supplied from the terminal board 43, so that it is unnecessary to apply soldering by arranging a power supply wiring pattern in the base substrate 2 or the like. Accordingly, the connection process for power supply is made easier and, because there is no need for soldering and joining, solder cracks occurring in the base substrate 2 and the LED module 3 resulting from a thermal shock can be prevented. It is also possible to maintain a sufficient distance and avoid engagement between the fastening device and the LED module, wherein the creation of a wiring pattern on the base substrate 2 can be omitted. Therefore, even if the cover 4 and the base substrate 2 are engaged and further affixed to the main body 11 by the screws 5 made of metal, insulation can be retained among the screw 5, the base substrate 2, and the LED module 3, whereby sufficient insulation can be secured between the LED module 3 and the main body 11.

The LED module 3 can also be separated from the screws 5 in a manner whereby reduced forces are applied from the screw 5 to the LED module 3 when the base substrate 2 is fixed to the main body 11 with the screw so that damage in the LED module 3 otherwise resulting from a pressing load can be substantially reduced.

Moreover, the screw 5 may be made of metal, which means an inexpensive metal screw can be used. The base substrate 2, for which a metal member can be used, may further be made of an insulating member and it is therefore easier to realize insulation among the screw 5, the base substrate 2, and the LED module 3.

As represented in FIGS. 7-9, the cover 4 of the light-emitting device in another embodiment may include an optical member 7 for condensing light emitted from the LED module. The optical member 7 has a lens 7*a* and a lens housing 7*b* for holding the lens 7*a*. The lens 7*a* and the lens housing 7*b* may be integrally fixed on the cover 4. The cover 4 has two engagement holes 46 for fixing the optical member 7. The lens housing 7*b* has an engagement pawl (or flange) 74 to be engaged with the engagement hole 46. Note that a pair of the engagement hole 46 and the engagement pawl 74 or three or more pairs thereof may also be provided.

The lens 7a has a lens body 70 which constitutes a rotation body of a barrel shape made in various embodiments of resin and/or glass member or other equivalent materials. The lens body 70 has a concave surface portion 71 for condensing light in a bottom portion thereof, and a locking concave portion 72 arranged in upper circumference for locking and fixing the lens body 70 in the lens housing 7b. Note that the shape of the lens body 70 is not limited to a barrel shape and may be formed of other shapes as may be understood by one of ordinary skill in the art.

The lens housing 7b has a cylindrical frame 73 made of resin and/or metal member or other material. The cylindrical frame 73 has an engagement pawl 74 protruding downward from a side wall end on a bottom surface side thereof, and a locking convex portion 75 formed into a convex shape in the vicinity of an upper portion of the cylindrical frame 73. In the locking convex portion 75, when the lens 7a is inserted into the cylindrical frame 73, the lens 7a is locked by the locking concave portion 72 and fixed to the inside of the cylindrical frame 73.

As shown in FIG. 9, the optical member 7 and the LED chip 31 are arranged so that optical axes thereof coincide with each other, and the engagement pawl 74 of the optical member 7 is engaged with and fixed to the engagement hole 46 of the cover 4. Thus arranging the optical member 7 on the cover 4 makes it possible to arrange the optical member 7 to approach the LED chip 31, whereby light emitted from the LED chip 31 can be condensed and extracted without being diverged from the aperture 45, realizing better light utilization efficiency.

The present invention is not limited to the configuration of the above embodiments and various modifications are permissible within the scope of the present invention. For example, a plurality of light-emitting devices may also be arranged in the main body. A plurality of LED chips may also be arranged inside the LED module. Also, the LED chip may be directly mounted on the base substrate and the power supply input terminals arranged adjacently thereto. Moreover, in place of the lens, a milky cover may be used to realize luminance diffusion.

Thus, although there have been described particular embodiments of the present invention of a new and useful Light-Emitting Device with Insulated LED Modules, it is not intended that such references be construed as limitations upon the scope of this invention except as set forth in the following claims.

What is claimed is:

1. A light-emitting device comprising:

a base substrate comprising an insulating material;

an LED module comprising positive and negative power supply input terminals;

a device housing integrally formed of an insulating material shaped so as to cover the base substrate and the LED module when engaged therewith;

a plurality of terminal board modules having an insulating exterior portion integral to the device housing, an interior portion comprising an electrically conductive contact extending therefrom to engage a respective power supply input terminal of the LED module when the device housing is engaged with the base substrate, a terminal board entry portion shaped to receive an external power supply conductor wherein the conductor engages the contact; and wherein the base substrate and the device housing further comprise one or more through holes shaped to receive fastening devices when engaged therewith, the LED module further insulated thereby with respect to the fastening devices, wherein the exterior portions of the terminal board modules further comprise a surface shaped to engage a corresponding surface of the LED module when the device housing is coupled to the base substrate via the one or more fastening devices, and the LED module is pressure fitted thereby to the base substrate.

2. The light-emitting device of claim 1, the base substrate comprising a recess shaped to receive the LED module.

3. The light-emitting device of claim 1, the LED module comprising one or more LED chips coupled to an LED substrate, the LED chips electrically coupled to the power supply input terminals via printed leads in the LED substrate.

4. The light-emitting device of claim 3, the LED module comprising an LED chip, the device housing further comprising a recessed portion having an outer aperture of a first diameter and an inner aperture of a second aperture smaller than the first aperture and larger than a diameter of the LED chip, the recessed portion extending from an outer surface of the device housing to envelop the LED chip.

5. The light-emitting device of claim 4, an inner surface of the recessed portion of the device housing further comprising a reflective material layer.

6. The light-emitting device of claim 5, the reflective material comprising white resin.

7. A light-emitting device comprising:

a base substrate;

an LED module comprising a mounting substrate having a first surface configured to engage the base substrate, at least one of the base substrate and the mounting substrate comprising an insulating material, one or more LED chips mounted on a second surface of the mounting substrate and electrically coupled to first and second power supply input terminals mounted on the second surface of the mounting substrate;

a device housing integrally formed of an insulating material shaped so as to cover the base substrate and the LED module when engaged therewith; and a plurality of terminal board modules having an insulating exterior portion integral to the device housing, an interior portion comprising an electrically conductive contact extending therefrom to engage a respective power supply input terminal of the LED module when the device housing is engaged with the base substrate, a terminal board entry portion shaped to receive an external power supply conductor wherein the conductor engages the contact; and the base substrate and the device housing further comprising one or more through holes shaped to receive fastening devices when engaged therewith, the LED chips further insulated with respect to the fastening devices, wherein the exterior portions of the terminal board modules further comprise a surface shaped to engage a corresponding surface of the mounting substrate when the device housing is coupled to the base substrate via the fastening device, further wherein the mounting substrate is pressure fitted to the base substrate.

8. The light-emitting device of claim 7, the base substrate comprising a recess shaped to receive the mounting substrate.

9. The light-emitting device of claim 7, the device housing further comprising a recessed portion having an outer aperture of a first diameter and an inner aperture of a second aperture smaller than the first aperture and larger than a diameter of the LED chip, the recessed portion extending from an outer surface of the device housing to envelop the LED chip.

10. The light-emitting device of claim 9, further comprising:

a lens housing having an inner diameter greater than the diameter of the outer aperture of the device housing and further comprising first and second engagement flanges; and a lens shaped to fit within the recessed portion of the device housing, the device housing further comprising first and second engagement apertures configured to receive the engagement flanges of the lens housing when engaged therewith.

11. A light-emitting device comprising:

a base substrate;

an LED mounting substrate upon which is disposed first and second power supply input terminals and one or more LED chips electrically coupled to the power supply input terminals;

a device housing configured for coupling to the base substrate via one or more metallic fastening devices;

a plurality of terminal board modules formed of an insulating material and disposed within an interior of the device housing;

each terminal board module comprising a surface shaped to engage a corresponding surface of the LED mounting substrate when the device housing is coupled to the base substrate via one or more fastening devices, thereby pressure fitting the LED mounting substrate to the base substrate;

each terminal board module defining an interior within which is disposed an electrically conductive contact configured to engage a respective power supply input terminal when the device housing is coupled to the base substrate;

each terminal board module further comprising a terminal board entry portion shaped to receive an external power supply conductor provided via a corresponding aperture through the device housing, and wherein the conductor engages the respective contact disposed therein; and at least one of the base substrate and the mounting substrate further comprising an insulating material, whereby the LED chips are electrically insulated by the insulating materials with respect to the one or more fastening devices.

12. The light-emitting device of claim 11, the device housing further comprising a recessed portion having an outer aperture of a first diameter and an inner aperture of a second aperture smaller than the first aperture and larger than a diameter of the LED chip, the recessed portion extending from an outer surface of the device housing to envelop the LED chip.

13. The light-emitting device of claim 12, further comprising:

a lens housing having an inner diameter greater than the diameter of the outer aperture of the device housing and further comprising first and second engagement flanges; and a lens shaped to fit within the recessed portion of the device housing, the device housing further comprising first and second engagement apertures configured to receive the engagement flanges of the lens housing when engaged therewith.

14. The light-emitting device of claim 11, wherein the base substrate and the device housing each further comprise one or more through holes corresponding to an associated set of fastening holes on an outer surface of a lighting fixture within which the device is disposed, the holes shaped to receive a respective fastening device when engaged therewith, the LED module further insulated thereby with respect to the fastening device and the outer surface.

* * * * *